US011687109B2

(12) United States Patent
Eisenstadt et al.

(10) Patent No.: US 11,687,109 B2
(45) Date of Patent: Jun. 27, 2023

(54) SELF-TEST FOR LOW DROPOUT REGULATOR MEASUREMENT

(71) Applicant: University of Florida Research Foundation, Inc., Gainesville, FL (US)

(72) Inventors: William R Eisenstadt, Gainesville, FL (US); Anurag Tulsiram, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 136 days.

(21) Appl. No.: 17/186,755

(22) Filed: Feb. 26, 2021

(65) Prior Publication Data

US 2022/0276667 A1    Sep. 1, 2022

(51) Int. Cl.
*G01R 31/28* (2006.01)
*G05F 1/575* (2006.01)

(52) U.S. Cl.
CPC ......... *G05F 1/575* (2013.01); *G01R 31/2884* (2013.01)

(58) Field of Classification Search
CPC ............ G01R 31/2884; G01R 31/2886; G01R 31/2887; G01R 31/2889; G01R 31/2891; G01R 31/2896; G01R 31/30; G01R 31/3004; G01R 31/303; G01R 31/304; G01R 31/306; G01R 31/307; G01R 31/2881; G01R 31/2851; G01R 31/2844; G01R 31/2834; G01R 31/28; G05F 1/575; G05F 1/59; G05F 1/614; G05F 1/5735
See application file for complete search history.

(56) References Cited

U.S. PATENT DOCUMENTS

| | | | |
|---|---|---|---|
| 2007/0018621 A1* | 1/2007 | Mok | G05F 1/575 323/280 |
| 2008/0088287 A1* | 4/2008 | Andoh | G01R 31/2839 323/280 |
| 2008/0174289 A1* | 7/2008 | Gurcan | G05F 1/575 323/280 |

OTHER PUBLICATIONS

Karim Arabi et al. "Oscillation-Test Strategy for Analog and Mixed-Signal Integrated Circuits". 14th IEEE VLSI Test Symposium, pp. 476-482. Apr. 28-May 1, 1996.
(Continued)

*Primary Examiner* — Nguyen Tran
(74) *Attorney, Agent, or Firm* — Thomas | Horstemeyer, LLP

(57) ABSTRACT

The present disclosure describes systems and methods for identifying defective components in a power integrated circuit. In one such system, a voltage regulator circuit is embedded in an integrated circuit device, wherein the voltage regulator circuit includes a control feedback loop having a compensation capacitor that is configured to maintain a stable output voltage of the voltage regulator voltage at a set value or range. Additionally, a test circuitry is embedded in the integrated circuit device, wherein the test circuitry comprises a voltage source that is configured to generate a cyclical test input signal that passes through the control feedback loop. Accordingly, the test circuitry is configured to provide a test output signal to an output pin of the integrated circuit device that indicates a performance level of the compensation capacitor in the control feedback loop of the voltage regulator circuit. Other systems and methods are also included.

20 Claims, 18 Drawing Sheets

(56) References Cited

OTHER PUBLICATIONS

Karim Arabi et al. "Design for Testability of Integrated Operational Amplifiers using Oscillation-Test Strategy". IEEE Journal of Solid-State Circuits. vol. 33, No. 4, pp. 40-45. 1996.

Karim Arabi et al. "Design for Testability of Embedded Integrated Operational Amplifiers". IEEE Journal of Solid-State Circuits. vol. 33, No. 4, pp. 573-581, Apr. 1998.

Karim Arabi et al., "Oscillation-Test Methodology far Low-Cost Testing of Active Analog Filters". IEEE Transactions on Instrumentation and Measurement. vol. 48, No. 4, pp. 798-806, 1999.

Karim Arabi et al. "Testing Analog and Mixed-Signal Integrated Circuits Using Oscillation-Test Method". IEEE Transactions on Computer-Aided Design of Integrated Circuits and Systems. vol. 16, pp. 745-753. Jul. 1997.

* cited by examiner

| 65nm LDO Design Specifications |
|---|
| • Voltage supply: 1.8 to 2.5 V |
| • Minimum Dropout Voltage: 200mV |
| • Technology: UMC 65nmSP |
| • Output Current: 1mA to 50 mA |
| • Loop Gain: >50 dB |
| • Phase Margin: >45 deg |
| • Reference Voltage: 1.2 V |
| • Load Capacitance:100pF to 1nF |
| • Compensation Cap = 20pF |
| • PSRR(DC): >50dB<br>• Quiescent Current : 100uA |

FIG. 3

| 65nm LDO Design Parameters |
|---|
| • Voltage supply: 2.5 V |
| • Dropout Voltage: 100mV |
| • Technology: UMC 65nmSP |
| • Output Current: 100 to 500 mA |
| • Amp Gain: >60 dB |
| • VDSAT: 0.1 to 0.2 V |
| • Output Regulated Voltage: 1.5 V |
| • umc65sp NMOS: n_25od33_sp |
| • k'n=150uA/V |
| • Vtn =0.65 V |
| • umc65sp PMOS: p_25od33_sp |
| • k'n=71uA/V |
| • Vtp =0.55 V |
| • Reference Voltage: 1.2 V |
| • Output Capacitance:1uF |
| • ESR =1Ω |
| • No. of Fingers: 4 designs, 100 to 200 fingers |

FIG. 11B

| Output Voltage of LDO (Vout) | Load Current ($I_{LOAD}$) 10mA | Supply Voltage (Vin) | DC Gain of LDO in dB | | |
|---|---|---|---|---|---|
| | | | STB Analysis | Our Method | |
| | | | | Simulation | Chip Results |
| 1.6 V | 10mA | 1.8 | 75.294 | 72.356 | 71.564 |
| | | 2 | 87.531 | 85.344 | 84.354 |
| | | 2.2 | 91.147 | 90.454 | 90.114 |
| | | 2.5 | 93.328 | 92.1445 | 91.445 |
| | 20mA | 1.8 | 70.574 | 66.245 | 63.967 |
| | | 2 | 87.242 | 83.541 | 81.374 |
| | | 2.2 | 92.461 | 91.545 | 88.841 |
| | | 2.5 | 96.209 | 95.4545 | 91.355 |

FIG. 14

SELF-TEST FOR LOW DROPOUT REGULATOR MEASUREMENT

BACKGROUND

Industries, such as the automotive industry, need new methodologies for fault modeling and testing of power integrated circuits (ICs) to have far fewer part failures. Existing test techniques for power ICs and analog parts examine the external terminals of a part using a black box model but are insufficiently selective to achieve defect levels in the parts-per-billion range. Designers often build in robust feedback loops that compensate for manufacturing variations and provide high performance over a wide range of PVT (process, voltage, temperature) process corners. However, these feedback loops compensate for and mask detection of weak performance in power IC sub-circuits during testing.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 3 shows Miller compensated LDO design specifications for an exemplary embodiment of the present disclosure.

FIG. 11B shows LDO design parameters and SPICE parameters for the circuit layout of FIG. 11 in accordance with various embodiments of the present disclosure.

FIG. 14 shows a table of LDO DC loop gain measurements using stability analysis, circuit simulations, and LDO IC measurements in accordance with various embodiments of the present disclosure.

DETAILED DESCRIPTION

The present disclosure describes various embodiments of systems, apparatuses, and methods for identifying weak sub-circuits and marginal components in a power integrated circuit (IC) using internal test node structures, such as during bare die integrated circuit production testing. Culling power ICs with weak sub-circuits and marginal components can greatly reduce the power IC production test failures.

In accordance with the present disclosure, various embodiments of such systems and methods organize built in on-chip amplifiers within a power integrated circuit. In various embodiments, a power integrated circuit features a low dropout voltage regulator (LDO) IC or a general purpose voltage regulator IC, such that the amplifiers of the voltage regulator are configured into a self-testing mode.

In various embodiments, for a power integrated circuit featuring a low dropout voltage regulator IC, the test circuits inside the IC can include error amplifiers used in the IC voltage regulation control feedback loop and additional circuitry to create a self-test mode oscillator. In the test mode, the regulator amplifier(s) are configured to output a cyclical signal with a frequency that is sensitive to the regulator control feedback loop characteristics inside the IC. The performance of the power integrated circuit can be monitored via the output signal. Thus, voltage regulator characteristics can be measured in the test mode by observing a self-generated output frequency from the IC, which is less expensive than trying to measure the IC control feedback loop using laboratory bench equipment or using automated test equipment. Embodiments of the present disclosure allow for the low cost determination of a performance level of voltage regulator IC (e.g., good versus poor performance level) during manufacture and also can allow the testing of these ICs in the field, such as when used in automotive applications.

Figure 1:
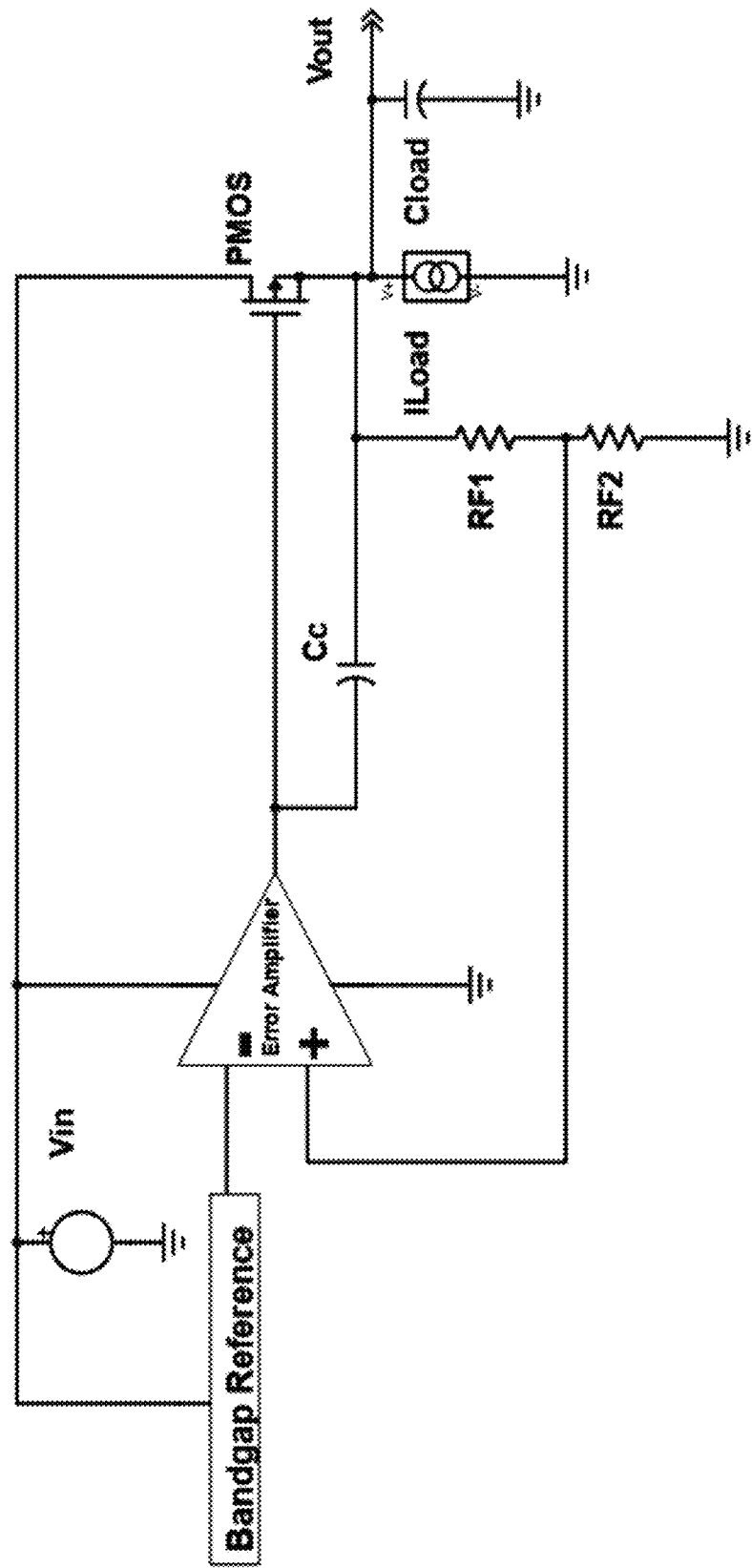
FIG. 1 is a block diagram of a Miller compensated low dropout voltage regulator (LDO) circuit.
Figure 2:
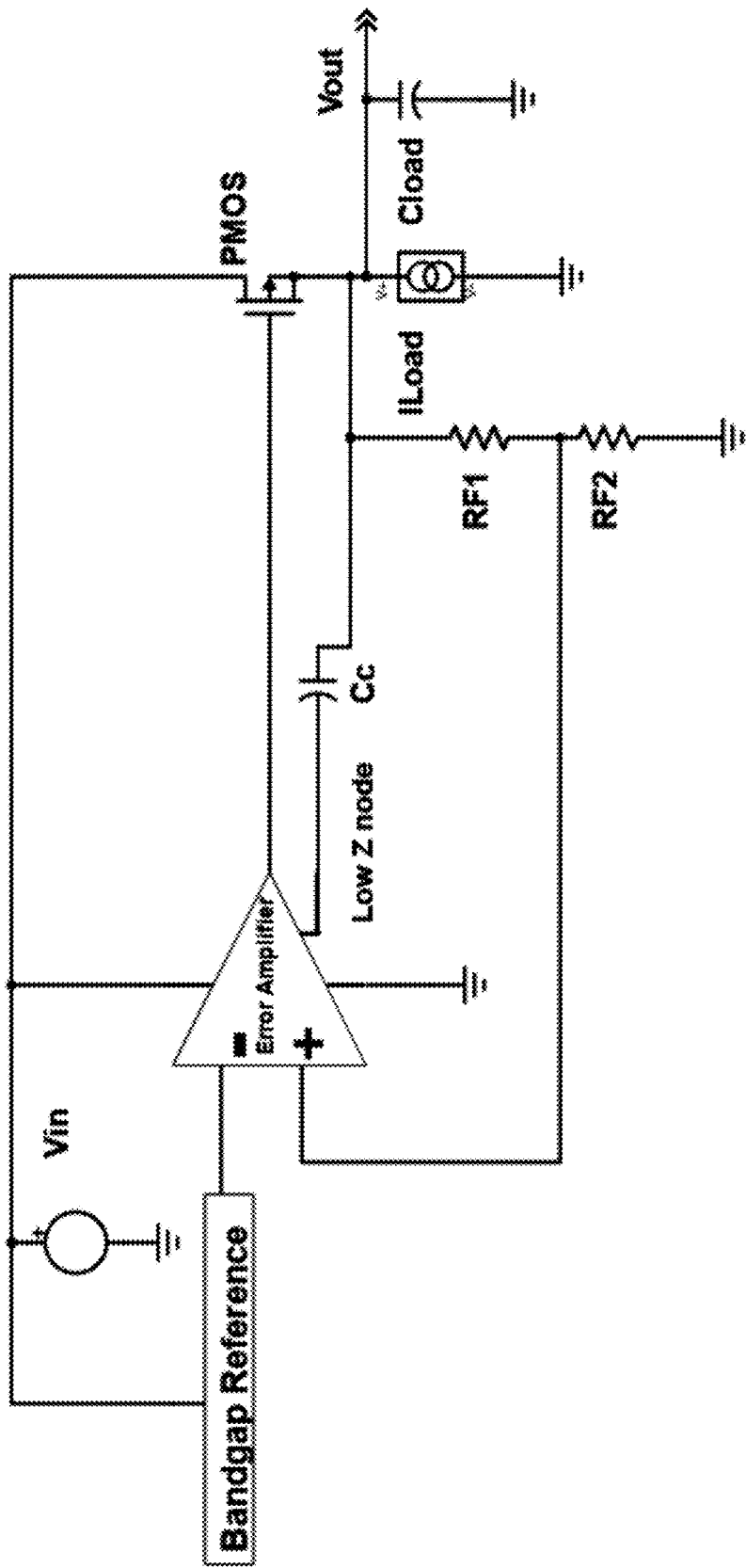
FIG. 2 is a block diagram of a cascode compensated LDO circuit.

Many modern LDOs use internal compensation techniques with Miller capacitors or cascode capacitors to provide LDO control feedback loop compensation. The block diagrams of a generic Miller compensated LDO with a p-channel field-effect transistor (PFET) is shown in FIG. 1 and a generic cascode compensated LDO with a PFET regulation transistor is shown in FIG. 2. In general, the feedback loop compensation circuit uses feedback resistors (RF1 and RF2) to set an output voltage of the LDO, and the compensation capacitor $C_C$ sets the shape of the LDO frequency response and lowers the gain at high frequencies so the LDO circuit is guaranteed to stable. This means the LDO does not oscillate and fail, whereas without the compensation capacitor $C_C$, the LDO may likely oscillate and fail.

In the Miller compensated LDO (FIG. 1), the compensation capacitor $C_C$ is directly connected between the output of the error amplifier and the drain of the PFET. In the cascode compensated LDO (FIG. 2), the compensation capacitor $C_C$ is connected between a low impedance node of the error amplifier and the drain of the PFET. Cascode compensation can be easily performed if the error amplifier has a telescopic op-amp topology or a folded cascode op-amp topology. Both these topologies have low impedance nodes for compensation connections and utilize an internal LDO node (usually the error amplifier output) as the dominant pole node. In general, cascode compensation yields a better PSRR (Power Supply Rejection Ratio) at high frequencies and increases the Miller multiplication factor which reduces the on-chip compensation capacitor value $C_C$ required for stability. In accordance with embodiments of the present disclosure, servo-loop techniques can be deployed to determine the loop capacitor values at the IC pins for a Miller compensated LDO or a cascode compensated LDO.

Figure 4:
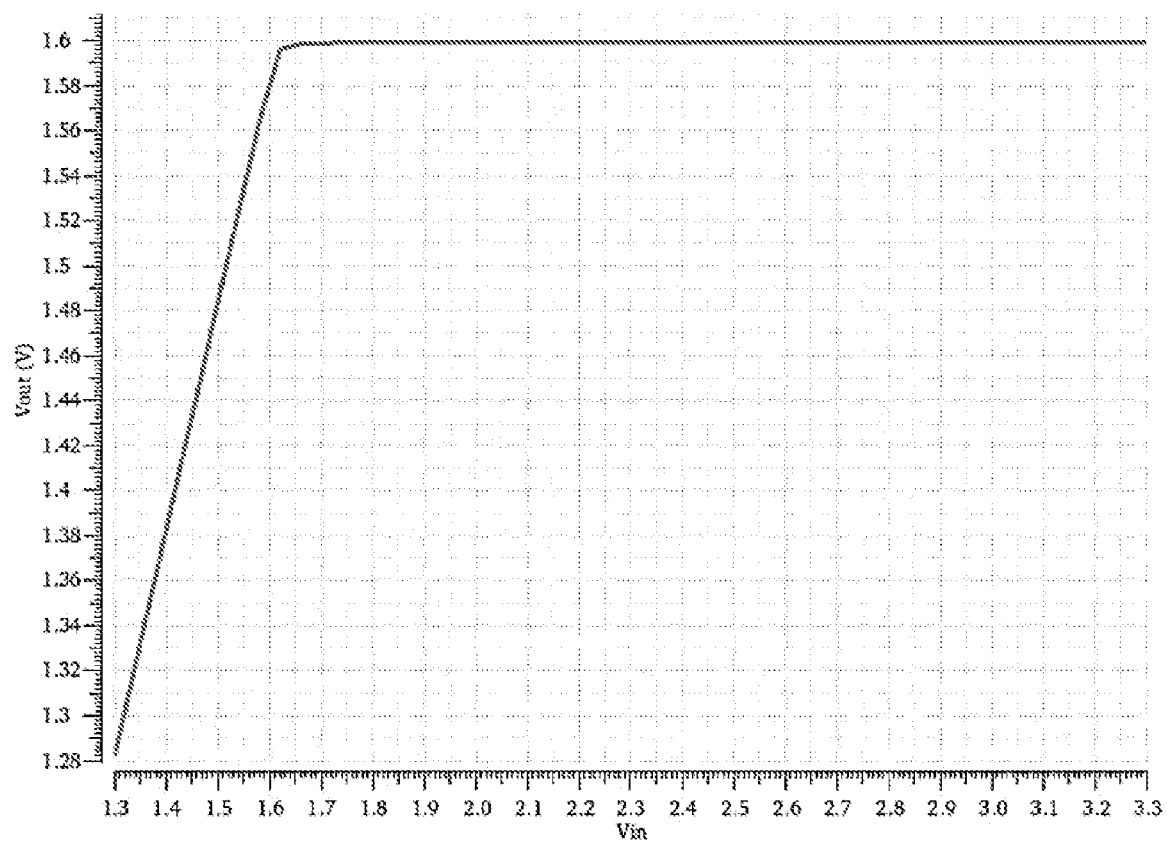
FIG. 4 shows simulations of a Miller compensated LDO line regulation with a 50 mA load.
Figure 5:
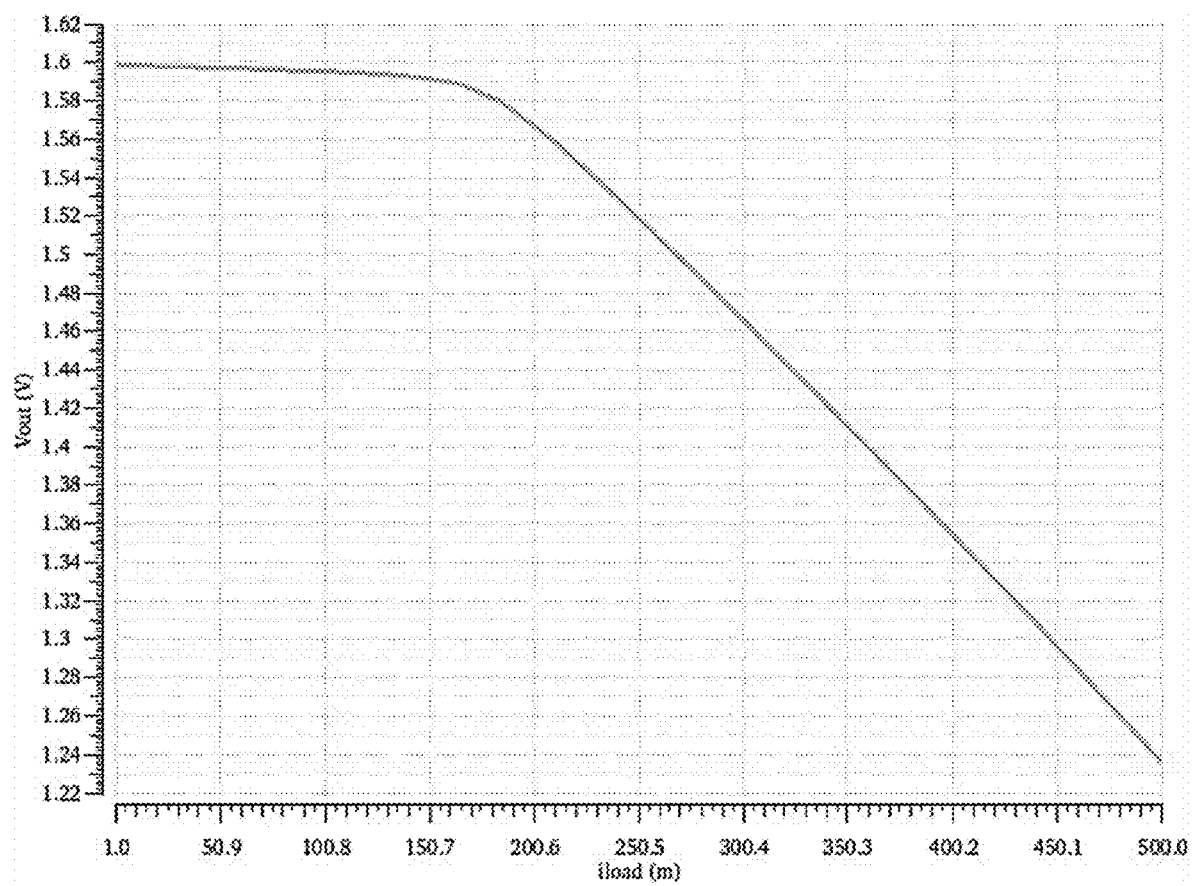
FIG. 5 shows simulation of a Miller compensated LDO load regulation with $V_{in}$=1.8V.

The present disclosure analyzes the Miller compensated LDO for automatic test equipment (ATE) testing but notes that control feedback loop testing results are very similar for both Miller and cascode topologies. Accordingly, FIG. 3 shows Miller capacitor compensated LDO 65 nm design specifications used to build a device schematic, in which the Miller compensated LDO had reasonable line regulation simulations shown in FIG. 4 and load regulation simulations shown in FIG. 5. In particular, FIG. 4 shows simulations of a Miller compensated LDO line regulation with a 50 mA load, and FIG. 5 shows simulation of a Miller compensated LDO load regulation with $V_{in}$=1.8V.

Figure 6:
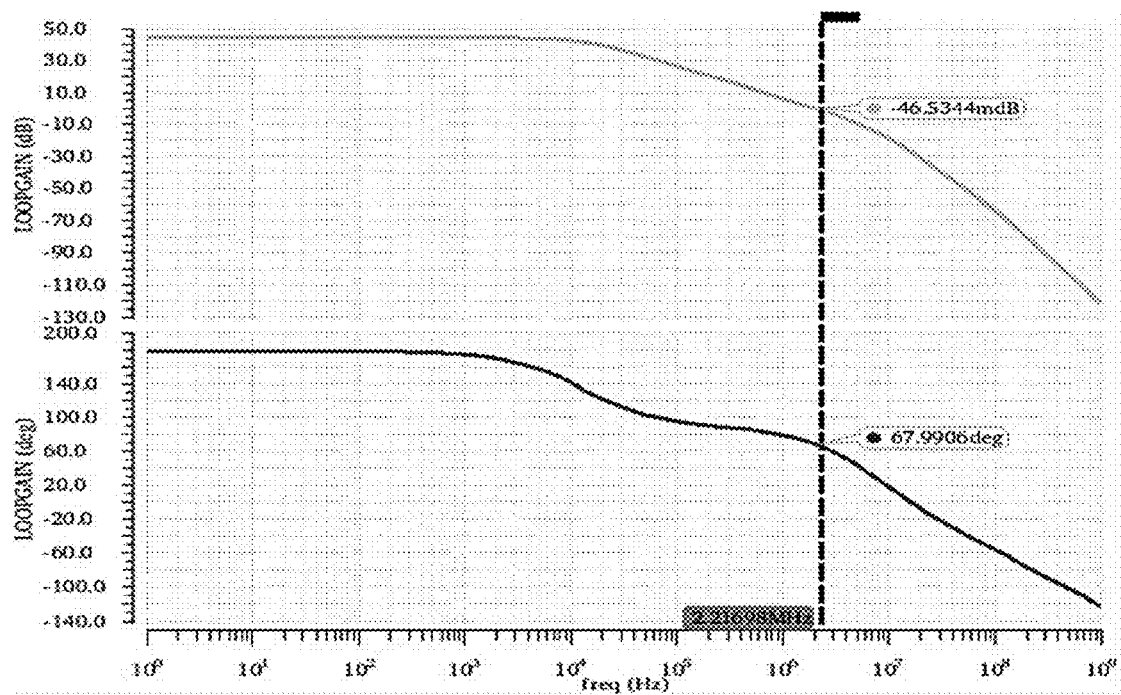
FIG. 6 shows a Miller compensated LDO gain-bandwidth plot.
Figure 7:
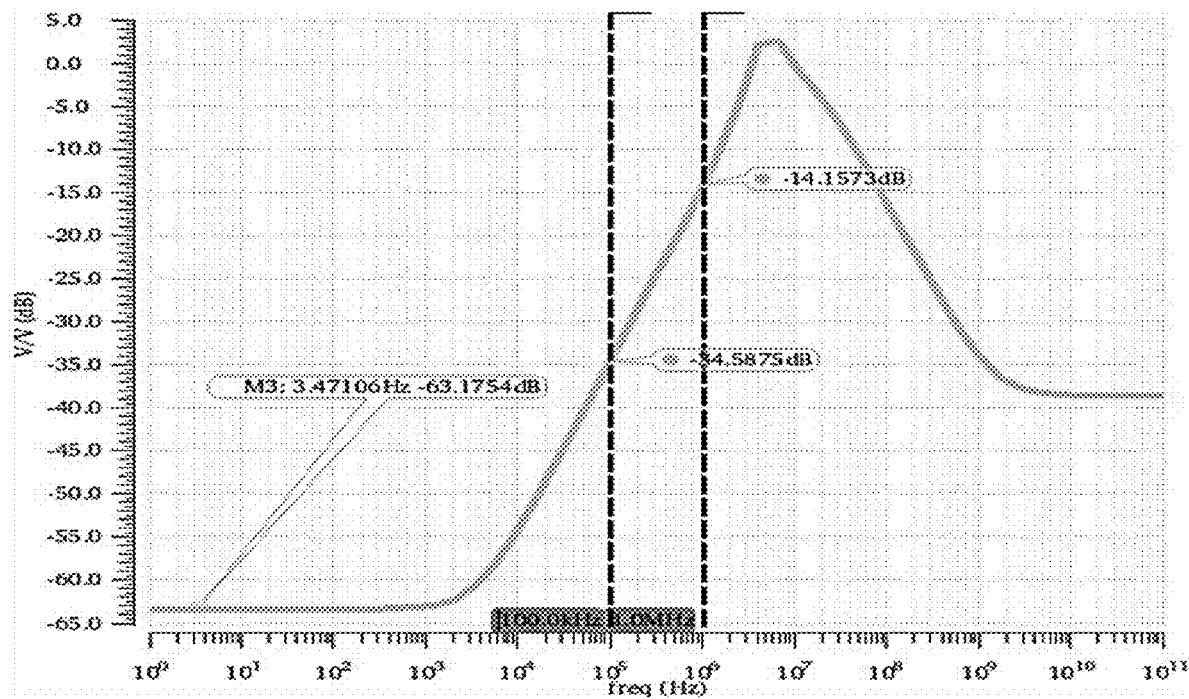
FIG. 7 shows PSRR simulations of a Miller compensated LDO for $I_{load}$=50 mA; $V_{in}$=1.8 V; and $V_{out}$=1.6 V.

Simulations of the control feedback loops show that the LDO compensation values are correlated to a gain-bandwidth plot. Accordingly, FIG. 6 shows the simulated Miller compensated LDO gain-bandwidth plot. Here, the unity gain frequency is 2.2 MHz with a phase of −67 degrees at this frequency. FIG. 7 shows the simulated PSRR of the Miller compensated LDO for $I_{load}$=50 mA; $V_{in}$=1.8 V; and $V_{out}$=1.6 V, where there is a correlation between the control feedback loop gain near cutoff and the PSRR which increases at cutoff. In addition to the gain-bandwidth plot, the PSRR plot can also be used to estimate the compensation capacitor value inside the LDO. FIG. 7 further shows a 63 dB PSRR up to about 1 KHz and which rises to −34.6 dB at 100 KHz and −14 dB at 1 MHz (near the 2.2 MHz cutoff).

Figure 8:
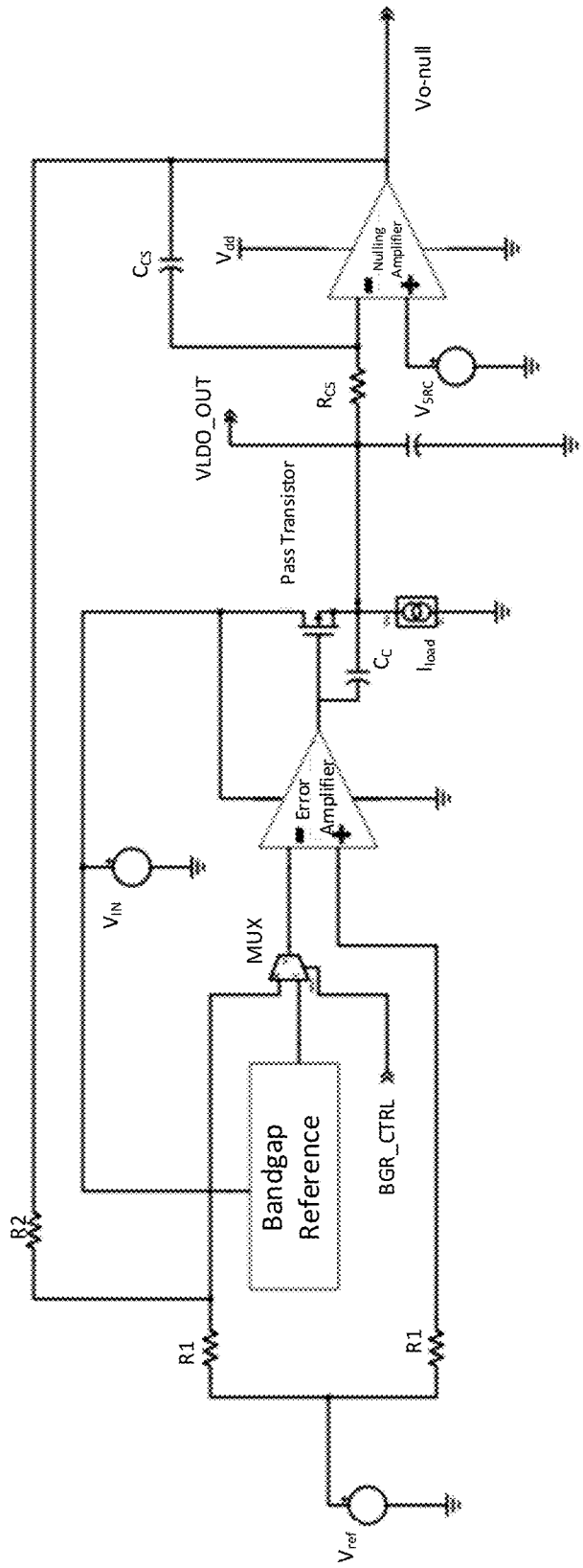
FIG. 8 shows simulations of a Miller compensated LDO inside a test servo-loop in accordance with various embodiments of the present disclosure.

In accordance with various embodiments, the Miller compensated LDO can be placed in a servo-loop test configuration, as shown in FIG. 8. The servo-loop configuration can be realized on a load board (testing interface unit) and used in an ATE test via a test measurement device (e.g., a vector network analyzer device) and has major advantages over small-signal measurements via prior art methods in ease of system calibration and determining stable loop resistors once at board setup.

In the circuit diagram of FIG. 8, the VLDO_OUT can be precisely controlled using the test source $V_{SRC}$. The equations for the determining the loop gain are as follows.

The value of $V_{o\text{-}null}$ is given by:

$$V_{in} = V_{in+} - V_{in-}$$

$$V_{o\text{-}null} - V_{ref} = \frac{1}{\beta} * V_{in}$$

$$V_{o\text{-}null} - V_{ref} = \frac{R_1 + R_2}{R_1} * V_{in} = \text{Gain} * V_{in}$$

The DC Loop Gain of the LDO is given by:

$$T = \frac{\Delta V_o}{\Delta V_{in}} = \frac{\Delta V_{src}}{\Delta V_{in}} = \text{Gain} * \frac{\Delta V_{src}}{\Delta V_{o\text{-}null}}$$

Figure 9:
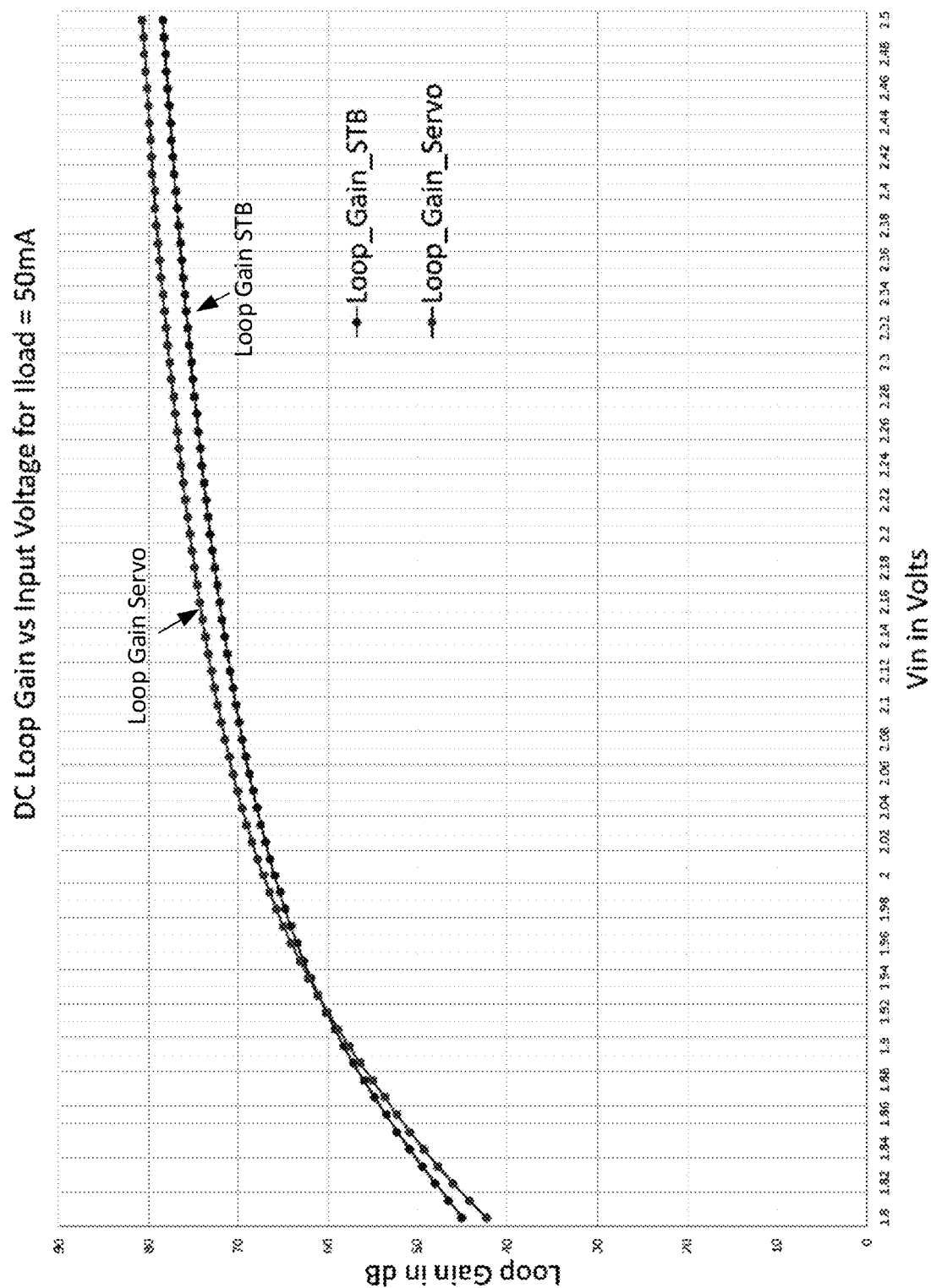
FIG. 9 shows a comparison of the simulation of a servo-loop test measurement of the DC gain variation and the stability analysis calculation of schematic loop gain in accordance with various embodiments of the present disclosure.

Next, FIG. 9 shows a servo-loop test simulation for a load board testing of the LDO with an internal Miller compensation capacitor. The small-signal DC gain servo-loop LDO measurements at the LDO I/O pins work for both Miller internal LDO capacitance compensation and external LDO capacitance compensation. In the figure, the servo-loop measurement of DC gain is compared with the extracted DC gain using stability analysis from a Cadence® Spectre® simulation platform. The simulated servo-loop gain agrees very well with the Spectre schematic loop analysis.

From the simulations, the Miller capacitor compensated LDOs shows a linear variation of control feedback loop cutoff frequency with one over the Miller capacitor value (i.e., the bandwidth BW is proportional to $1/C_C$). Thus, the LDO with Miller compensation capacitor control feedback loop is representative of what would be applicable for almost all internally compensated LDOs.

An exemplary load board servo-loop technique provides the possibility of characterizing the gain bandwidth curve using several (e.g., 3-4) frequency points over a range and extrapolating loop cutoff frequency & loop capacitance. Then, the LDO cutoff frequency can be determined with reasonable accuracy and high speed. Such an approach could lend itself to an ultraquick (e.g., 20 mS) ATE measurement of LDO control feedback loop capacitance via a test measurement device.

Figure 10:
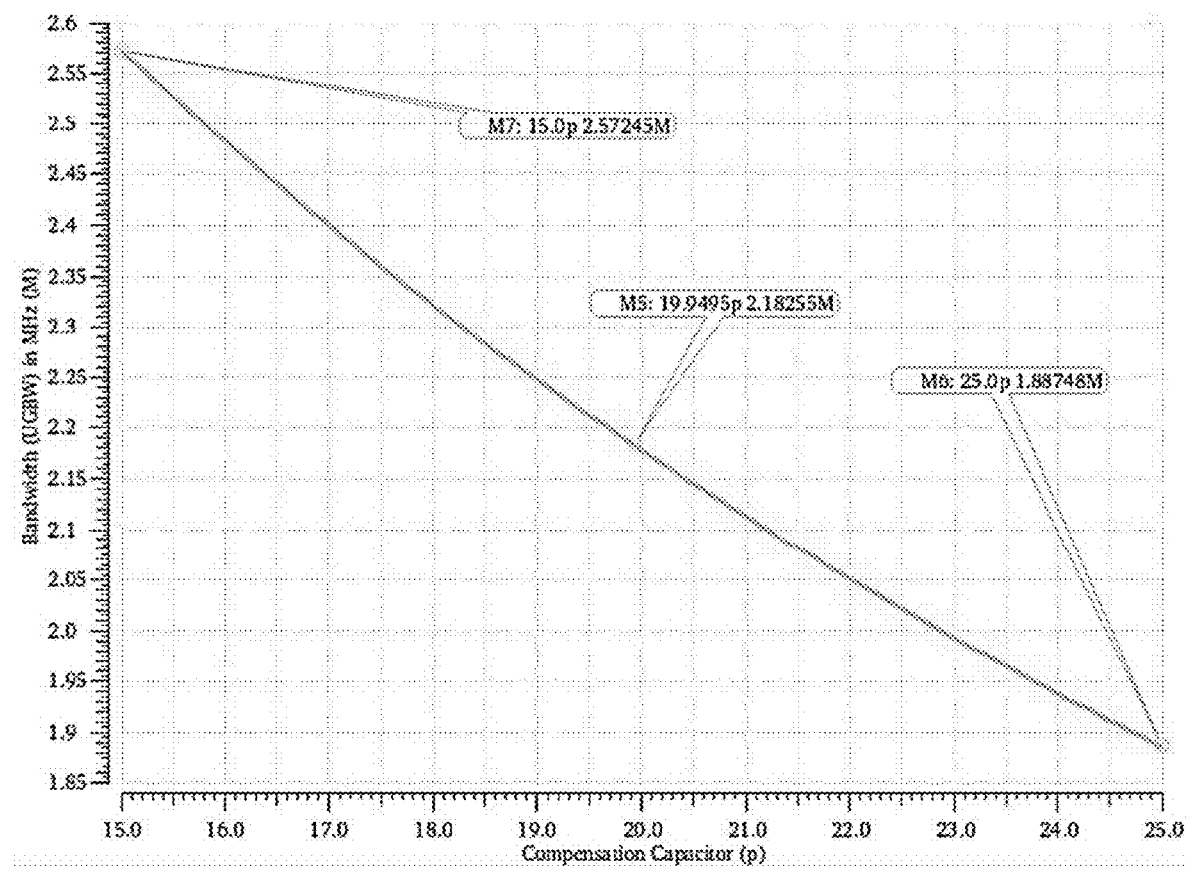
FIG. 10 shows a plot of simulated Miller compensated LDO gain-bandwidth product versus compensation capacitor values in accordance with various embodiments of the present disclosure.

Accordingly, FIG. 10 shows a simulation of the Miller compensated LDO control feedback loop bandwidth versus compensation capacitance. For a nominal compensation capacitor $C_C$ of 20 pF, the control feedback loop bandwidth is shown to be 2.2 MHz. If the compensation capacitor $C_C$ is lowered to 15 pF, then the control feedback loop bandwidth is 2.6 MHz, and if the compensation capacitor $C_C$ is raised to 25 pF, the control feedback loop bandwidth is 1.9 MHz. Thus, the bandwidth can be used to determine the internal compensation capacitance in almost a roughly linear fashion. So, defects in a compensation capacitor (as demonstrated by a bad or poor on-chip compensation capacitor value or performance level) can be identified using the control feedback loop bandwidth. For example, by injecting three signals into the servo-loop that are 20% above nominal cutoff, at the cutoff frequency (2.2 MHz) and 20% below the LDO control-loop cutoff frequency, one can determine the bounds of the true production IC control-loop gain. Then, if the LDO compensation capacitor $C_C$ is close to specification (e.g., close to a nominal capacitance value or range), the gain at 2.2 MHz will be near unity.

Figure 11A:
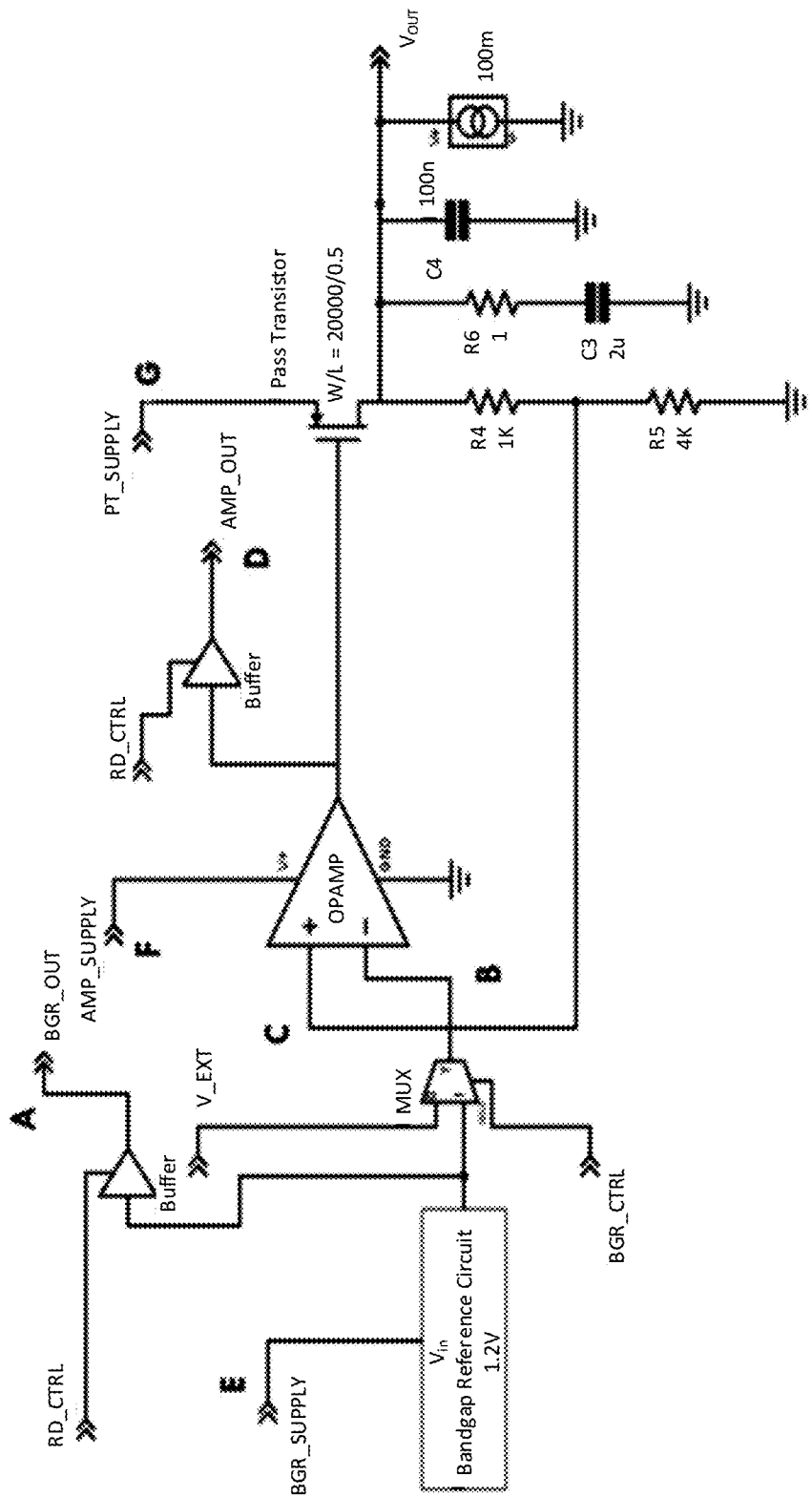
FIG. 11A is a block diagram of a 65 nm CMOS LDO design in accordance with various embodiments of the present disclosure.

As such, in accordance with various embodiments, a servo-loop can be integrated or embedded on a power integrated circuit for implementing a small-signal test on-chip. Accordingly, an integrated servo-loop can utilize a small area on an LDO chip compared to the other sub-circuits or components. In various embodiments, a servo-loop circuit can be configured to characterize LDO control feedback loops at the pins on an ATE tester quickly as part of built-in self-test (BIST) technology. In one such embodiment, an LDO circuit (FIG. 11A) having an error amplifier (which compares the reference voltage and scaled down output voltage), a bandgap reference (BGR), pass transistor (output driver), feedback resistances, and compensation capacitances was integrated with a servo-loop circuit. Correspondingly, FIG. 11B shows a table of technology parameters in for 65 nm CMOS LDO design. While the accessible points for a generic LDO circuit are $V_{in}$, $V_{out}$, and GND, additional internal test points can include points A, B, C, and D, as shown in FIG. 11A, to characterize the LDO sub-circuits.

Figure 12:
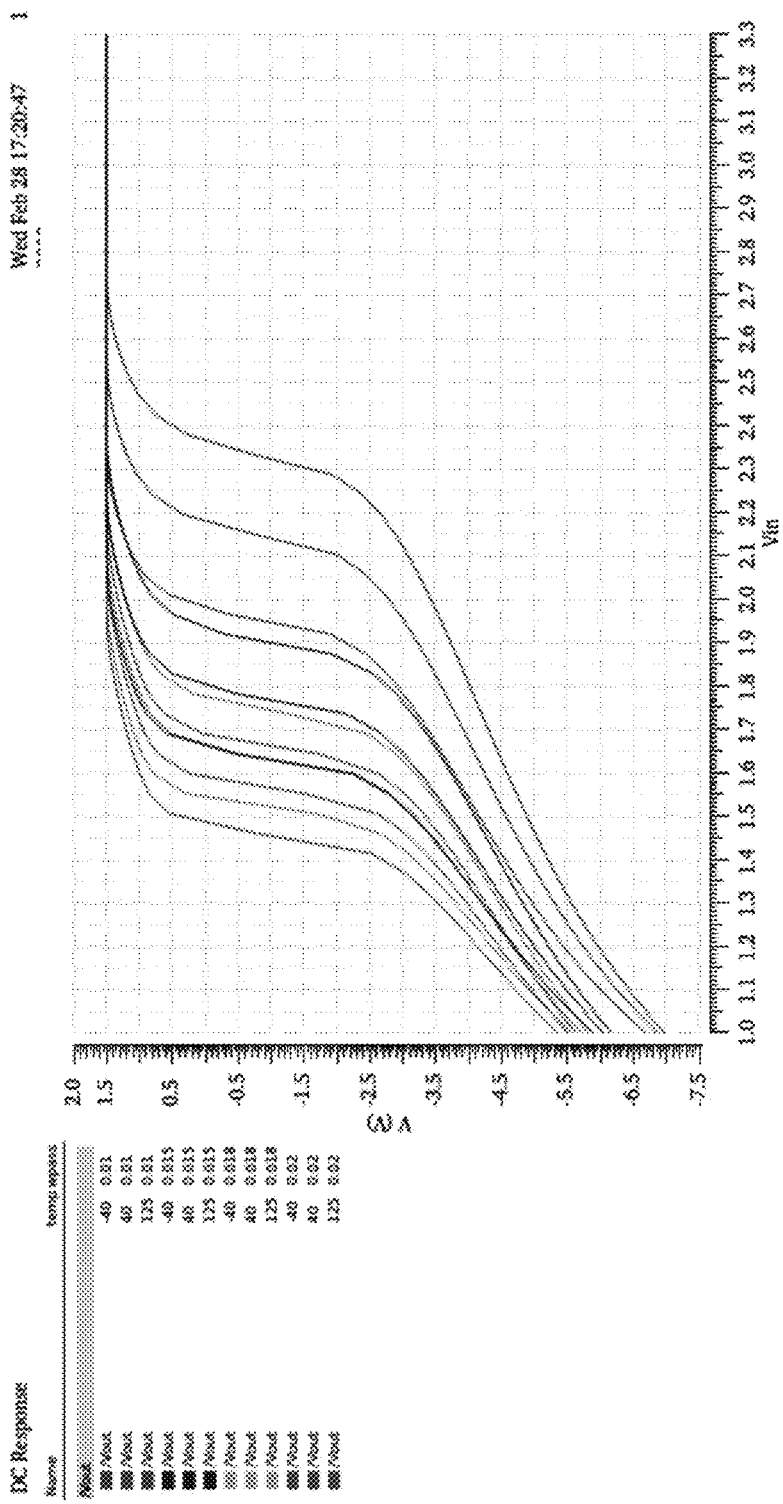
FIG. 12 shows a simulation of the dropout characteristics of a 65 nm CMOS LDO design at different temperatures.

In the 65 nm CMOS LDO, for various embodiments, a buffer and a transmission gate are added at the output of the error amplifier and bandgap reference in order to read, more accurately, voltages off the chip during testing. During simulation of the functionality of the LDO system, there was a dropout voltage of 140 mV at load current of 200 mA with a 1.6V output voltage. Simulations in 65 nm CMOS, as shown in FIG. 12, were performed using the multi-fingered PFET LDO modeled in dropout, where reduced numbers of fingers modeled a weak PFET with inactive or partially active fingers or high Vth fingers. Simulations of dropout characteristics performance of a multi-fingered PMOS pass transistor at high temperatures show the greatest variations. Temperatures at which simulations are performed are −40° C., 40° C., and 125° C.

Providing tests for LDO sub-circuit response data facilitates several avenues to improve production yields, since there is the potential to cull LDOs prone to failure by finding outlier performance inside the sub-circuits. In addition, a statistical database for LDO sub-circuit response can be measured and form a basis to determine weak sub-circuits and acceptable sub-circuits. Pre-determined weak LDO sub-circuits can be tested after accelerated aging and harsh usage conditions to demonstrate the critical failure and yield issues.

Figure 13:
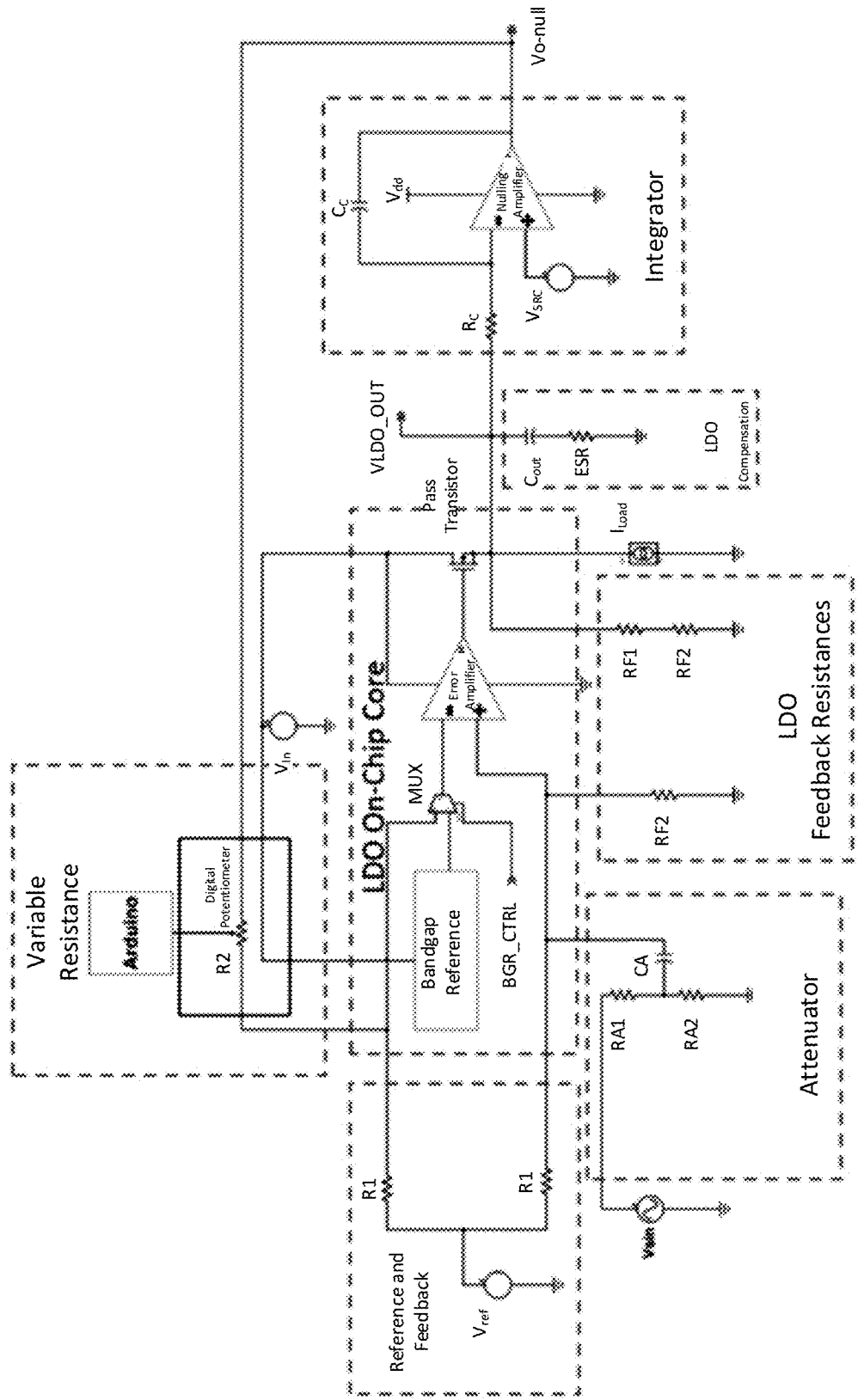
FIG. 13 is a block diagram of an in-situ test bench for LDO control feedback loop gain and phase margin measurement based on a servo loop in accordance with various embodiments of the present disclosure.
Figure 15:
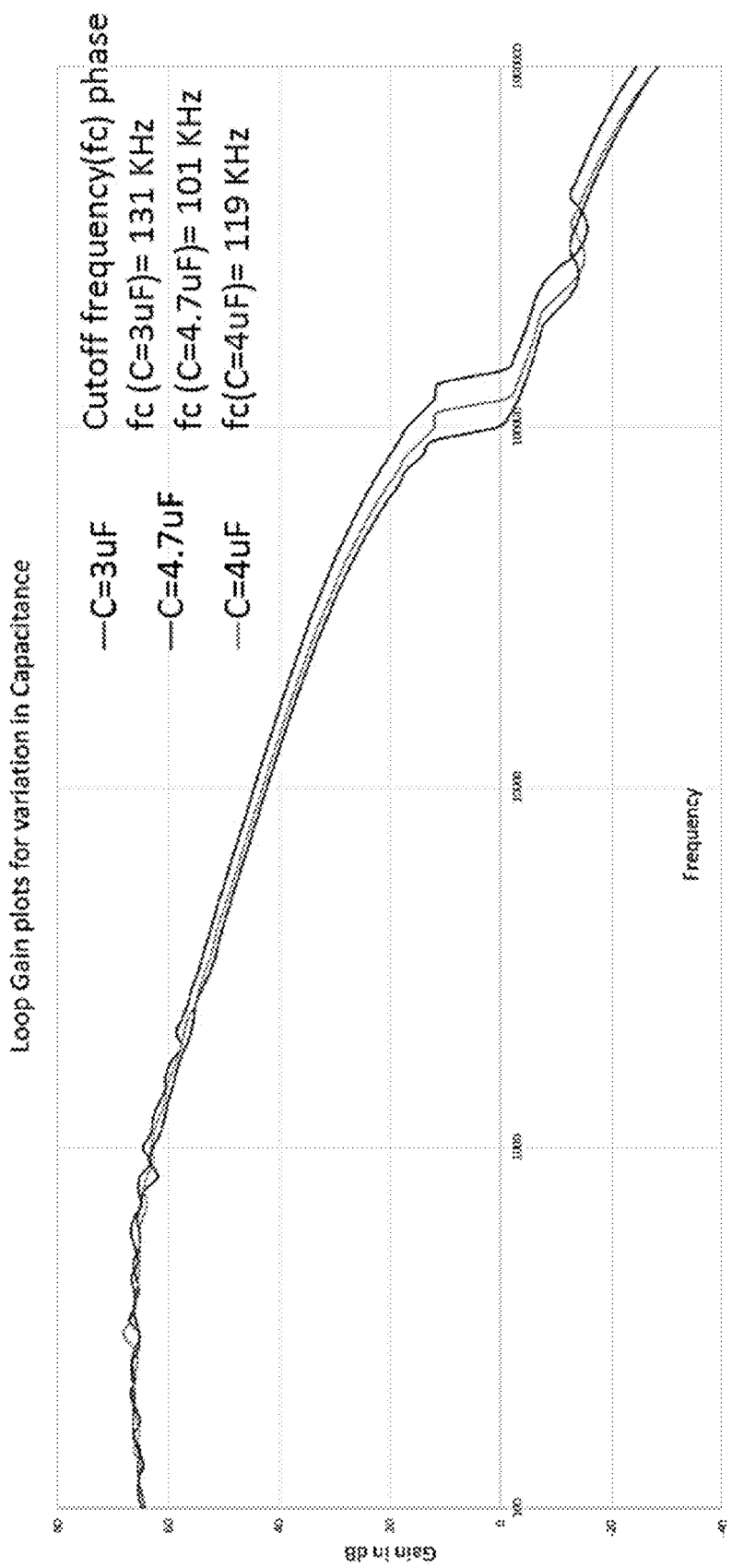
FIG. 15 shows a plot of LDO control feedback loop gain versus frequency for different capacitor values of a compensation capacitor in the control feedback loop on an exemplary LDO small-signal test board in accordance with various embodiments of the present disclosure.

In various embodiments, a small-signal LDO control feedback loop characterization method can be implemented at the IC pins of a power integrated circuit in order to determine LDO stability and reliability. For example, unstable compensation in the LDO loop performance is a major cause of safety concern in automotive electronics. Accordingly, small-signal measurements can be used to detect control feedback loop circuit element variations. For example, FIG. 13 shows an exemplary LDO small signal control feedback loop measurement schematic or test board, in accordance with various embodiments of the present disclosure, and FIG. 14 shows a table of DC loop gain characterization using stability (STB) analysis, simulations, and IC measurements on the exemplary test board of FIG. 13. For PSRR measurement, a test input signal was injected at $V_{in}$ through an injection transformer. Correspondingly, the LDO control feedback loop cutoff frequency ($f_c$) measurements of a test output signal (at an output pin of the integrated circuit chip or device) show the ability to determine outlier values of C3, the critical compensation capacitor in FIG. 11. For example, at C3=3.0 uF, $f_c$=101 KHz; at C3=4.0 uF, $f_c$=119 KHz; and at C3=4.7 uF, $f_c$=131 KHz. Additionally, FIG. 15 shows the variation of the magnitude of the LDO response with control feedback loop capacitor C3.

In various embodiments, for a power integrated circuit featuring a low dropout voltage regulator IC, the test circuits inside the IC can include error amplifiers used in the IC voltage regulation control feedback loop and additional circuitry to create a self-test mode oscillator. In the test mode, the regulator amplifier(s) output a cyclical signal with a frequency that is sensitive to the regulator control feedback loop characteristics inside the IC. The performance of the power integrated circuit can be monitored via a test output signal at an output of the voltage regulator circuit (that is coupled to an output pin of the integrated circuit device). Thus, voltage regulator characteristics can be measured in the test mode by observing a self-generated output frequency from the IC, which is less expensive than trying to measure the IC control feedback loop using laboratory bench equipment or using automated test equipment.

Figure 16:
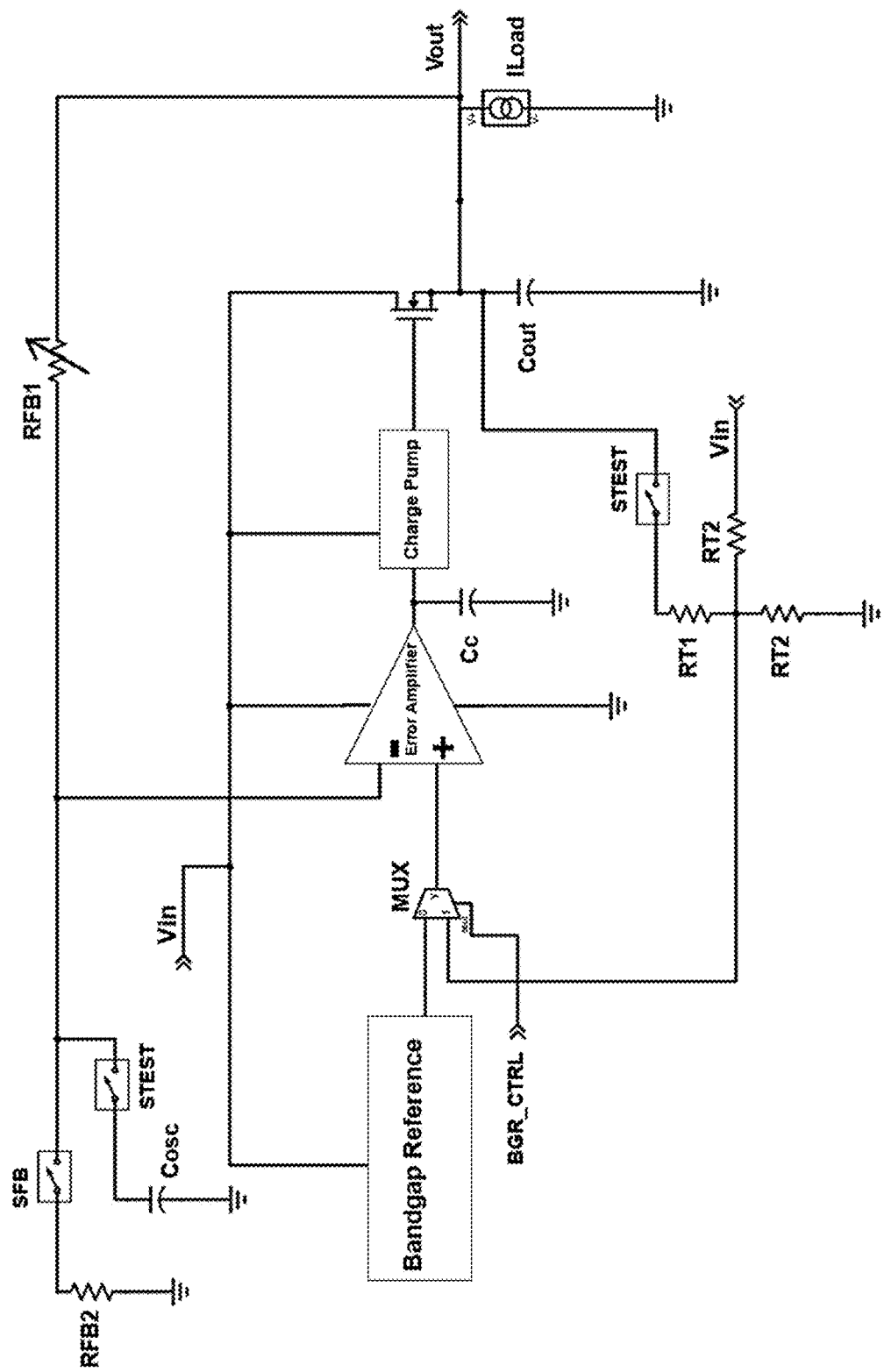
FIG. 16 shows an exemplary LDO oscillator test bench in accordance with various embodiments of the present disclosure.

Accordingly, FIG. 16 shows an exemplary LDO oscillator test bench in accordance with various embodiments, in which a bandwidth of an LDO can be measured by initiating a test mode of the power integrated circuit (featuring the LDO voltage regulator circuit) that converts the design under test (DUT) into an oscillator. Regarding the conditions for sustainable oscillations, the LDO core (error amplifier and PFET transistor) is modeled as a single pole system, in which the transfer function of the standalone LDO core can be represented as:

$$a_V(s) = \frac{a_V}{\left(1 + \frac{s}{w_{p1}}\right)}$$

and the unity gain bandwidth (BW) represented as:

$$w_T = A_V * w_{p1}$$

Feedback will convert the LDO core transfer function (TF) into a $2^{nd}$ Order System such that the new transfer function (TF) can be represented as:

$$A_V(s) = \frac{a_V(s)}{(1 + a_V(s) * \beta(s))} \text{ where}$$

$$\beta(s) = \left(\frac{1}{1 + \frac{s}{w_{p2}}}\right) - G; G = \frac{R_{T2}}{R_{T2} + R_{T1}}; w_{p2} = \frac{1}{R_{osc} * C_{osc}}.$$

Therefore:

$$A_V(s) = \frac{a_V * w_{p1} * (w_{p2} + s)}{s^2 + (w_{p1} + w_{p2} - G * a_V * w_{p1})s + ((1 - G)a_V * w_{p1} * w_{p2} + w_{p1} * w_{p2})}$$

For the system to oscillate, its poles must be placed on an imaginary axis of the s-domain. Equating the co-efficient of $1^{st}$ order term to 0, we get:

$$w_{p1} + w_{p2} - G * a_V * w_{p1} = 0$$

Thus:

$$G = \frac{w_{p1} + w_{p2}}{a_V * w_{p1}}$$

Comparing the TF with a generic $2^{nd}$ order system, we have $$w_{osc}^2 = ((1-G)a_V + 1) * w_{p1} * w_{p2})$$

Since $(1-G)a_V \gg 1$, $w_{osc}^2 = (1-G)a_V * w_{p1} * w_{p2})$. Also, $w_T = a_v * w_{p1}$. Therefore:

$$w_T = \frac{w_{osc2}}{(1-G) * w_{p2}}.$$

Figure 17:
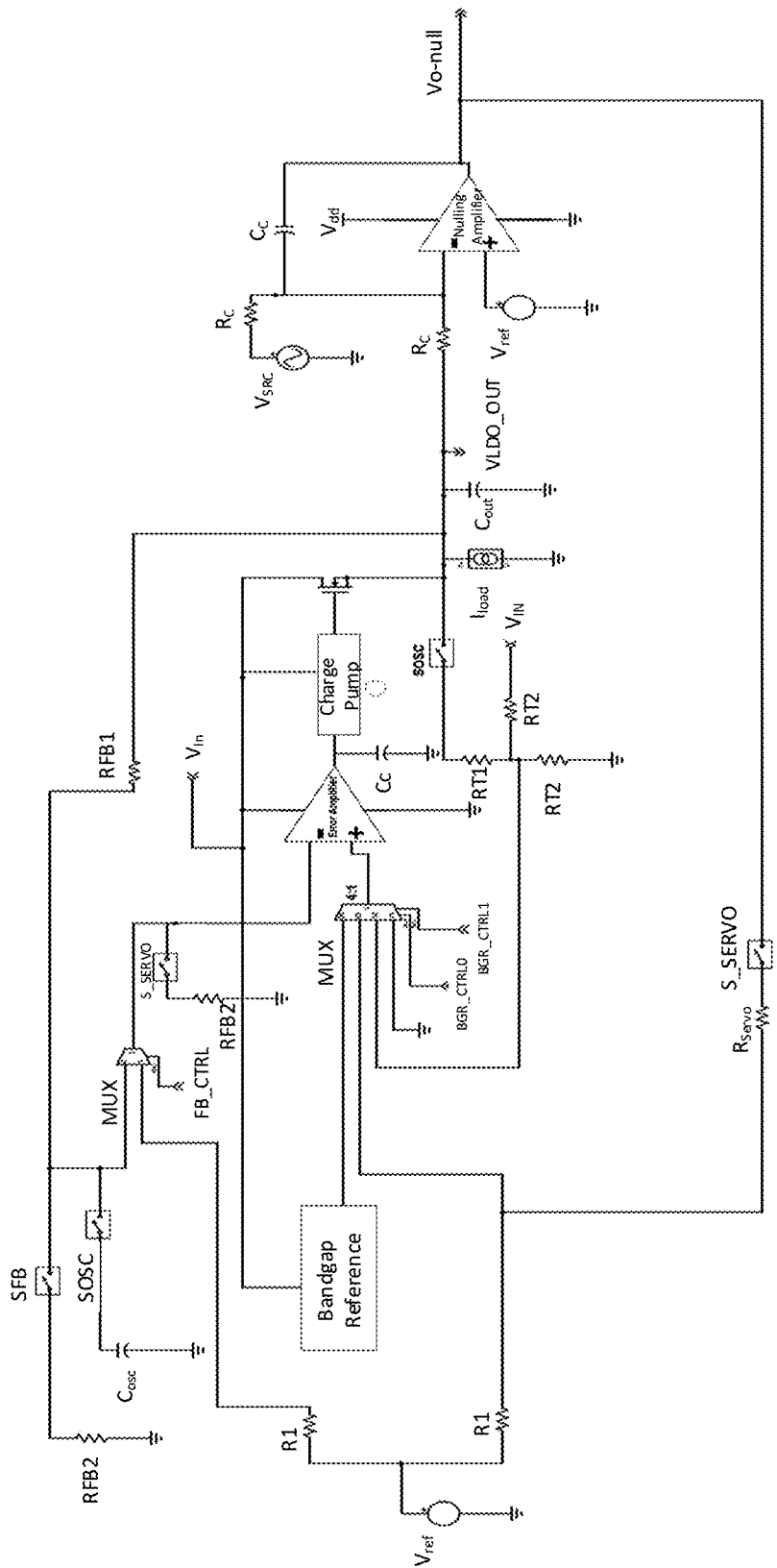
FIG. 17 shows an exemplary test bench LDO servo loop and oscillator test bench in accordance with various embodiments of the present disclosure.

Next, FIG. 17 shows an exemplary test bench LDO servo loop and oscillator test bench in accordance with various embodiments. The circuit diagram of FIG. 17 shares components and circuit elements with the test servo loop environment of FIG. 8 and the oscillator environment of FIG. 16 with switching elements that allow for activation of test modes associated with the servo loop or the oscillator components. For example, test circuitry embedded with the voltage regulator circuitry on an integrated circuit device or chip can comprise at least one switching element that is configured to enable a voltage regulator circuit to operate independently from the test circuitry in a regular mode of operation and is configured to enable the voltage regulator circuit to operate in conjunction with the test circuitry in a test mode of operation.

Figure 18:
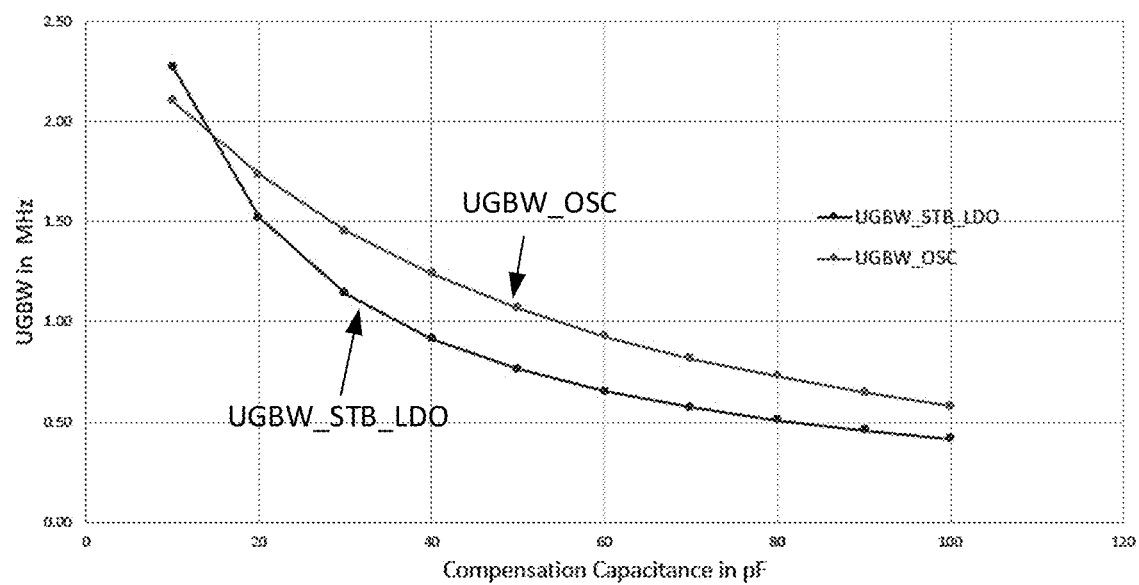
FIG. 18 shows a comparison of unity gain bandwidth of the LDO versus compensation capacitance for the oscillator test bench configuration and stability analysis in accordance with various embodiments of the present disclosure.

Correspondingly, FIG. 18 shows a comparison of unity gain bandwidth (UGBW) of the LDO versus compensation capacitance for the oscillator (OSC) test bench configuration and stability (STB) analysis. Accordingly, defects in the compensation capacitance can be detected by observing the bandwidth via an oscillator test bench configuration or mode.

It should be emphasized that the above-described embodiments are merely possible examples of implementations, merely set forth for a clear understanding of the principles of the present disclosure. Many variations and modifications may be made to the above-described embodiment(s) without departing substantially from the principles of the present disclosure. All such modifications and variations are intended to be included herein within the scope of this disclosure.

Therefore, at least the following is claimed:

1. A power integrated circuit system comprising:
a voltage regulator circuit embedded in an integrated circuit device, wherein the voltage regulator circuit includes a control feedback loop having a compensation capacitor that is configured to maintain a stable output voltage of the voltage regulator voltage at a set value or range; and
a test circuitry embedded in the integrated circuit device, wherein the test circuitry comprises a voltage source that is configured to generate a cyclical test input signal that passes through the control feedback loop, wherein the test circuitry is configured to provide a test output signal to an output pin of the integrated circuit device, wherein the test output signal comprises a cyclical signal with a frequency value that indicates a performance level of the compensation capacitor in the control feedback loop of the voltage regulator circuit.

2. The system of claim 1, wherein the voltage regulator circuit comprises a low dropout voltage regulator circuit.

3. The system of claim 2, wherein the low dropout voltage regulator circuit comprises a Miller compensated low dropout voltage regulator circuit.

4. The system of claim 2, wherein the low dropout voltage regulator circuit comprises a cascode compensated low dropout voltage regulator circuit.

5. The system of claim 1, wherein the control feedback loop further comprises an error amplifier, a pass transistor, a bandgap reference, and feedback resistors.

6. The system of claim 1, wherein the output pin is coupled to an output of the voltage regulator circuit.

7. The system of claim 1, wherein the test circuitry further comprises at least one switching element that is configured to enable the voltage regulator circuit to operate independently from the test circuitry in a regular mode of operation and is configured to enable the voltage regulator circuit to operate in conjunction with the test circuitry in a test mode of operation.

8. The system of claim 1, further comprising a test measurement device that is configured to measure the test output signal across a range of frequency values and indicate if the compensation capacitor is defective by determining a capacitance value of the compensation capacitor based on the measured test output signal and comparing the capacitance value with a nominal capacitance value for the compensation capacitor.

9. The system of claim 8, wherein the capacitance value is determined by computing a frequency bandwidth of the control feedback loop and determining the capacitance value that corresponds to the computed frequency bandwidth.

10. The system of claim 1, further comprising a test measurement device that is configured to measure the test output signal across a range of frequency values, wherein the range of frequency values includes a cutoff frequency of a bandwidth of the control feedback loop at a nominal capacitance value of the compensation capacitor, wherein the test measurement device is further configured to determine the performance level of the control feedback loop by evaluating a gain of the bandwidth of the control feedback loop at the cutoff frequency of a nominal compensation capacitor.

11. A method of testing performance of a power integrated circuit system comprising:
providing a regulated output voltage by a voltage regulator circuit embedded in an integrated circuit device, wherein the voltage regulator circuit includes a control feedback loop having a compensation capacitor that is configured to maintain a stable output voltage of the voltage regulator circuit at a set value or range;
generating, by a test circuitry embedded in the integrated circuit device, a cyclical test input signal that passes through the control feedback loop; and
providing, by the test circuitry embedded in the integrated circuit device, a test output signal to an output pin of the integrated circuit device, wherein the test output signal comprises a cyclical signal with a frequency value that indicates a performance level of the compensation capacitor in the control feedback loop of the voltage regulator circuit.

12. The method of claim 11, wherein the voltage regulator circuit comprises a low dropout voltage regulator circuit.

13. The method of claim 12, wherein the low dropout voltage regulator circuit comprises a Miller compensated low dropout voltage regulator circuit.

14. The method of claim 12, wherein the low dropout voltage regulator circuit comprises a cascode compensated low dropout voltage regulator circuit.

15. The method of claim 11, wherein the control feedback loop further comprises an error amplifier, a pass transistor, a bandgap reference, and feedback resistors.

16. The method of claim 11, wherein the test circuitry further comprises at least one switching element that is configured to enable the voltage regulator circuit to operate independently from the test circuitry in a regular mode of operation and is configured to enable the voltage regulator circuit to operate in conjunction with the test circuitry in a test mode of operation.

17. The method of claim 11, further comprising measuring the test output signal across a range of frequency values and indicating if the compensation capacitor is defective by determining a capacitance value of the compensation capacitor based on the measured test output signal and comparing the capacitance value with a nominal capacitance value for the compensation capacitor.

18. The method of claim 17, wherein the capacitance value is determined by computing a frequency bandwidth of the control feedback loop and determining the capacitance value that corresponds to the computed frequency bandwidth.

19. The method of claim 11, further comprising:
measuring the test output signal across a range of frequency values, wherein the range of frequency values includes a cutoff frequency of a bandwidth of the control feedback loop at a nominal capacitance value of the compensation capacitor; and
determining the performance level of the control feedback loop by evaluating a gain of the bandwidth of the control feedback loop at the cutoff frequency of a nominal compensation capacitor.

20. The method of claim 11, wherein the output pin is coupled to an output of the voltage regulator circuit.

\* \* \* \* \*